US007847395B2

(12) United States Patent
Baek et al.

(10) Patent No.: US 7,847,395 B2
(45) Date of Patent: Dec. 7, 2010

(54) PACKAGE AND PACKAGE ASSEMBLY OF POWER DEVICE

(75) Inventors: Seung-han Baek, Bucheon-si (KR); Seung-won Lim, Bucheon-si (KR)

(73) Assignee: Fairchild Korea Semiconductor, Ltd., Bucheon-si (KR)

( * ) Notice: Subject to any disclaimer, the term of this patent is extended or adjusted under 35 U.S.C. 154(b) by 565 days.

(21) Appl. No.: 11/680,061

(22) Filed: Feb. 28, 2007

(65) Prior Publication Data

US 2007/0205503 A1 Sep. 6, 2007

(30) Foreign Application Priority Data

Mar. 3, 2006 (KR) ..................... 10-2006-0020413

(51) Int. Cl.
*H01L 23/04* (2006.01)
*H01L 23/48* (2006.01)

(52) U.S. Cl. ....................... 257/712; 257/730; 257/739; 257/796; 257/E23.123; 257/E23.124; 257/E23.08; 257/E23.083; 438/51; 438/112; 438/122; 438/124; 438/126; 438/127

(58) Field of Classification Search ................. 257/730, 257/739, 796, 669, 675, 712, E23.128, E23.116, 257/E23.08, E23.082, E23.083, E23.101, 257/E23.102, E23.104, E23.123, E23.124; 438/51, 53, 55, 112, 122, 124, 126, 127, 438/110, 111, 121, 125

See application file for complete search history.

(56) References Cited

U.S. PATENT DOCUMENTS

| | | | | |
|---|---|---|---|---|
| 5,760,425 | A | 6/1998 | Kobayashi et al. | |
| 2004/0196634 | A1 * | 10/2004 | Mallik et al. | 361/704 |
| 2006/0081978 | A1 * | 4/2006 | Huang et al. | 257/706 |
| 2006/0202323 | A1 | 9/2006 | Shinohara | |

* cited by examiner

*Primary Examiner*—A. Sefer
*Assistant Examiner*—Ermias Woldegeorgis
(74) *Attorney, Agent, or Firm*—Thomas R. FitzGerald, Esq.; Hiscock & Barclay, LLP

(57) ABSTRACT

A package and a package assembly for a power device having a high operation voltage and impulse voltage are provided. The package assembly for a power device comprises an assembly wherein the power device is encapsulated and electrically connected to a lead protruding outside the package, and an isolation spacer filling a clearance distance between the package and a heat sink attached to the package.

16 Claims, 7 Drawing Sheets

250 210 L2 L1 h1 h2 210 101 102 103 104 110 105 105

250 210 210 330b 330 330 150 110 330b 330a 102 103 104 101 330a 105 105

PACKAGE AND PACKAGE ASSEMBLY OF POWER DEVICE

CROSS-REFERENCE TO RELATED PATENT APPLICATION

This application claims the benefit of Korean Patent Application No. 10-2006-0020413, filed on Mar. 3, 2006, in the Korean Intellectual Property Office, the disclosure of which is incorporated herein in its entirety by reference.

BACKGROUND OF THE INVENTION

1. Field of the Invention

The present invention relates to a package and a package assembly, and more particularly, to a package and a package assembly for a power device.

2. Description of the Related Art

A power semiconductor device such as a silicon-controlled rectifier (SCR), a power transistor, an insulated-gate bipolar transistor (IGBT), a MOS transistor, a power rectifier, a power regulator, an inverter, a converter, or a combination thereof, is designed to operate at a voltage of 30V-1000V or greater. Since a power device operates at a high voltage, unlike a logic or memory device, its package must have excellent heat dissipation and high voltage insulation properties.

FIG. 1 is a sectional view of a conventional package 50 for a power device with a heat sink 60.

Referring to FIG. 1, a substrate 10 on which a power device 5 is formed is connected to a heat conductive electrical isolator 20 which, in turn, is connected to a metallic heat conductive plate 30 for heat release. The power device 5, the substrate 10, the isolator 20, and the conductive plate 30 are encapsulated by epoxy mold compound (EMC) or ceramic molding members. The encapsulated power device 5 is electrically connected to a lead 40 protruding outside the package 50.

In general, the metallic heat conductive plate 30 is exposed at the surface of the package 50. The heat sink (or a cooling block) 60 is connected to the exposed metallic heat conductive plate 30 to absorb and dissipate heat from the heat conductive plate 30. The heat sink 60 is generally formed of a metal having high heat conductivity. When the power device 5 operates at a high voltage, an electrical short may occur between the lead 40 of the package 50 and the heat sink 60. To prevent this, isolation distances such as a creepage distance $L_1$ and a clearance distance $L_2$ are determined considering the intended voltages such as the operation voltage and the impulse voltage when the package 50 and the heat sink 60 are designed. As the operation voltage and the impulse voltage of the power device increase, the creepage distance $L_1$ and clearance distance $L_2$ must also increase.

To increase heat dissipation capacity, it may be necessary to increase the area of the heat sink 60. For example, as illustrated in FIG. 1, the width of the heat sink 60 may increase from $A_1$ to $A_2$. To reduce the manufacturing cost of the heat sink 60 or for various other design considerations, the area of the heat sink 60 may also be increased. For example, one heat sink 60 may be used in the package for two power devices, to reduce the cost. Also, the contact area between the heat sink 60 and the package 50 may need to be increased to enhance heat transfer.

However, the width of the heat sink 60 may need to be restricted to maintain the clearance distance $L_2$, and the contact area between the heat sink 60 and the package 50 may need to be restricted to maintain the creepage distance $L_1$ in order to ensure isolation when the power device operates at a high voltage.

SUMMARY OF THE INVENTION

The present invention provides a package for a power device, which can be used with heat sinks of various sizes and contact areas according to the amount of heat to be dissipated, manufacturing cost or various other design conditions, without the prior art level of restraint on creepage distance.

The present invention also provides an assembly for a power device, which can be used with heat sinks of various sizes and contact areas according to the amount of heat to be dissipated, manufacturing cost or various other design conditions, without the prior art levels of restraint on clearance distance and creepage distance.

According to an aspect of the present invention, there is provided a package for a power device, in which the power device is encapsulated and electrically connected to a lead protruding outside the package, the package comprising: an irregular portion formed on the package between the lead and a heat sink attached to the package, wherein the maximum height of the irregular portion is less than the height of a portion contacting the heat sink.

The irregular portion is formed on an edge of the package where the lead is positioned. The irregular portion may have a linear shape parallel to the edge of the package where the lead is positioned. Further, the irregular portion may be formed integrally along the edge on the package where the lead is positioned, without interruption.

According to another aspect of the present invention, there is provided a package assembly for a power device, comprising: a package in which a power device is encapsulated and is electrically connected to a lead protruding outside the package; and an isolation spacer filling a clearance distance between the package and a heat sink attached to the package.

The isolation spacer may be formed of inorganic oxide, rubber or polymer (resin) materials. The isolation spacer may include an edge portion protruding horizontally past the edge of the heat sink. The isolation spacer may also include an edge portion covering part of the lead.

The package may include an irregular portion formed between the heat sink and the lead. In this case, the isolation spacer includes another irregular portion shaped to fit into the irregular portion of the package.

The isolation spacer may be formed in one piece so as to fill the clearance distance between the package and the heat sink. The isolation spacer may include a support portion fixed to a printed circuit board on which the package is mounted.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings in which preferred embodiments of the invention are shown. This invention may, however, be embodied in many different forms, and should not be construed as being limited to the embodiments set forth herein. In drawings, the relative thickness and size of some components may be exaggerated for clarity. Like numbers refer to like elements throughout the specification.

Figure 1:
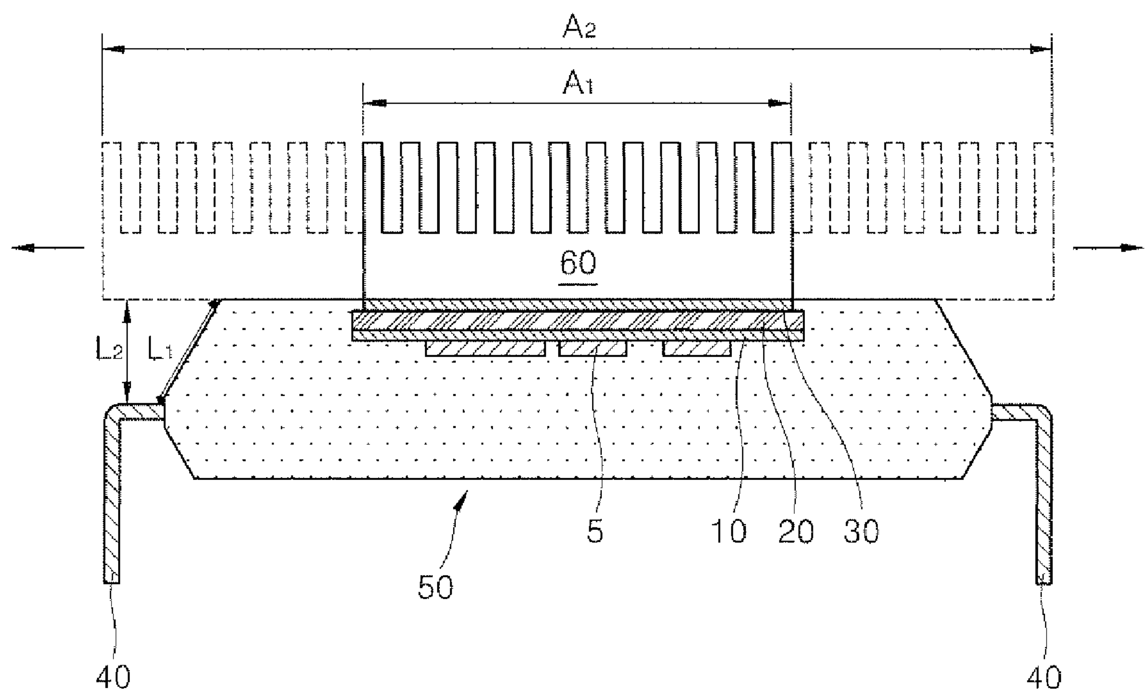
FIG. 1 is a sectional view of a conventional package and attached heat sink for a power device.
Figure 2A:
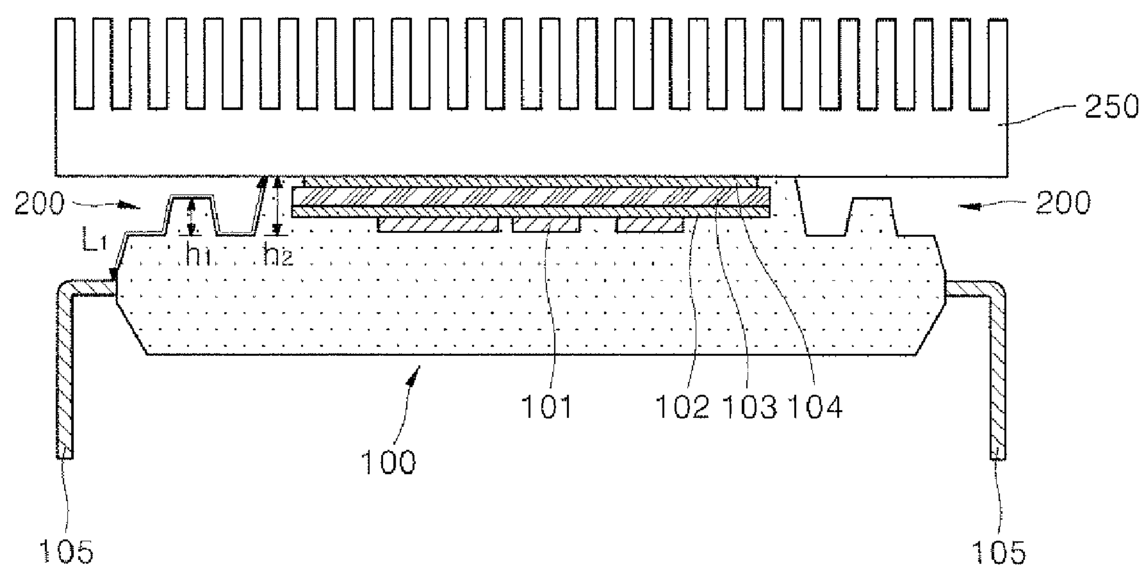
FIGS. 2A and 2B are sectional views of packages for a power device and attached heat sinks for power devices according to two embodiments of the present invention.
Figure 2B:
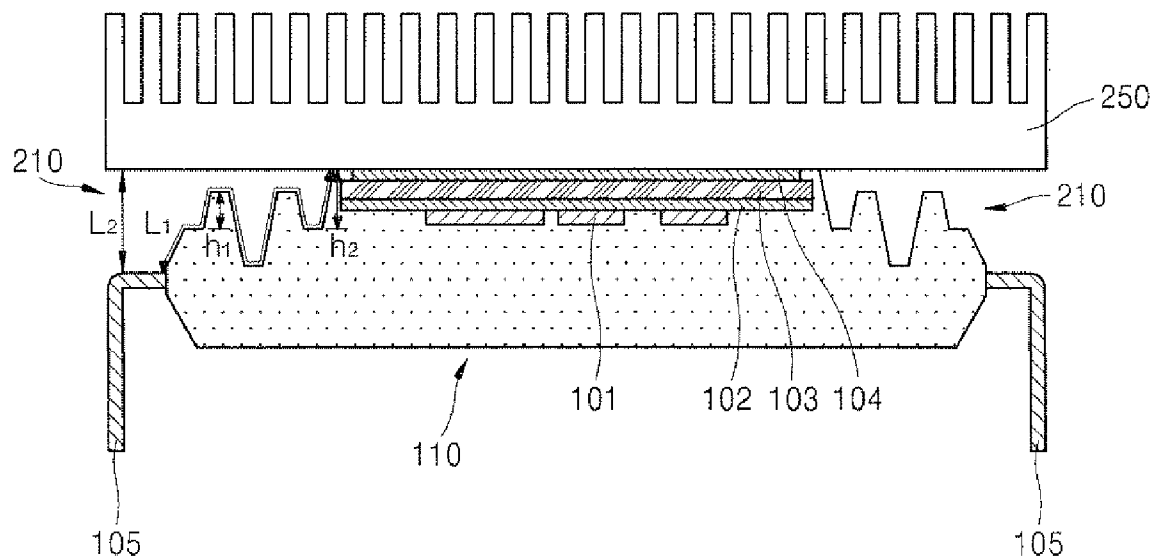

FIGS. 2A and 2B are sectional views of packages 100 and 110, respectively, each with heat sinks 250 for power devices according to two embodiments of the present invention.

Referring to FIGS. 2A and 2B, a substrate 102 on which a power device 101 is formed is attached to a metallic heat conductive plate 104 and encapsulated to transfer heat generated by the power device 101 outside the package 100. For electrical isolation between the power device 101 and the metallic heat conductive plate 104, an electrical isolator 103 may be positioned between the substrate 102 and the metallic heat conductive plate 104. The metallic heat conductive plate 104, which is exposed outside the packages 100 and 110, contacts a heat sink 250 attached to the packages 100 and 110.

The package 100 includes an irregular portion 200 thereon between the heat sink 250 and a lead 105. The irregular portion 200 may have one raised part as shown in FIG. 2A. Alternatively, an irregular portion 210 may have a shape in which raised parts and recessed parts are arranged alternately as shown in FIG. 2B.

The maximum height $h_1$ of the irregular portions 200 and 210 is less than the height $h_2$ of a portion of the package 100 contacting the heat sink 250, so that the irregular portions 200 and 210 do not contact the heat sink 250 when the heat sink 250 is installed.

If the irregular portion 200 and 210 were to contact the heat sink 250, the creepage distance $L_1$ would be shortened. Thus, for the irregular portions 200 and 210 to increase the creepage distance $L_1$ it is preferable that its maximum height is less than the height of the portion of which the packages 100 and 110 contacts the heat sink 250.

The packages 100 and 110 with the irregular portions 200 and 210 increase the creepage distance $L_1$ by increasing the surface path from the lead 105 to the heat sink 250, which is an electric conductor. As a result, the present invention provides a package having a sufficient creepage distance $L_1$ when used for a power device with an operation voltage or impulse voltage in the range of 600V-2000V.

Figure 3A:
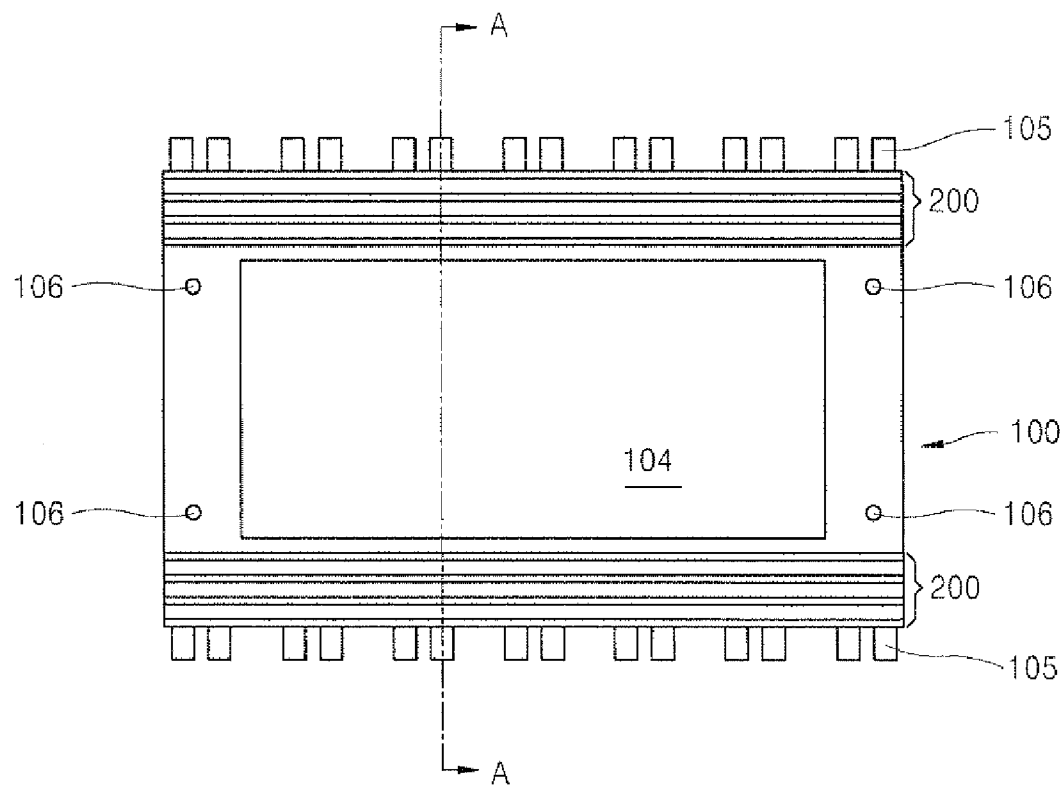
FIGS. 3A and 3B are plan views of the packages of FIGS. 2A and 2B.
Figure 3B:
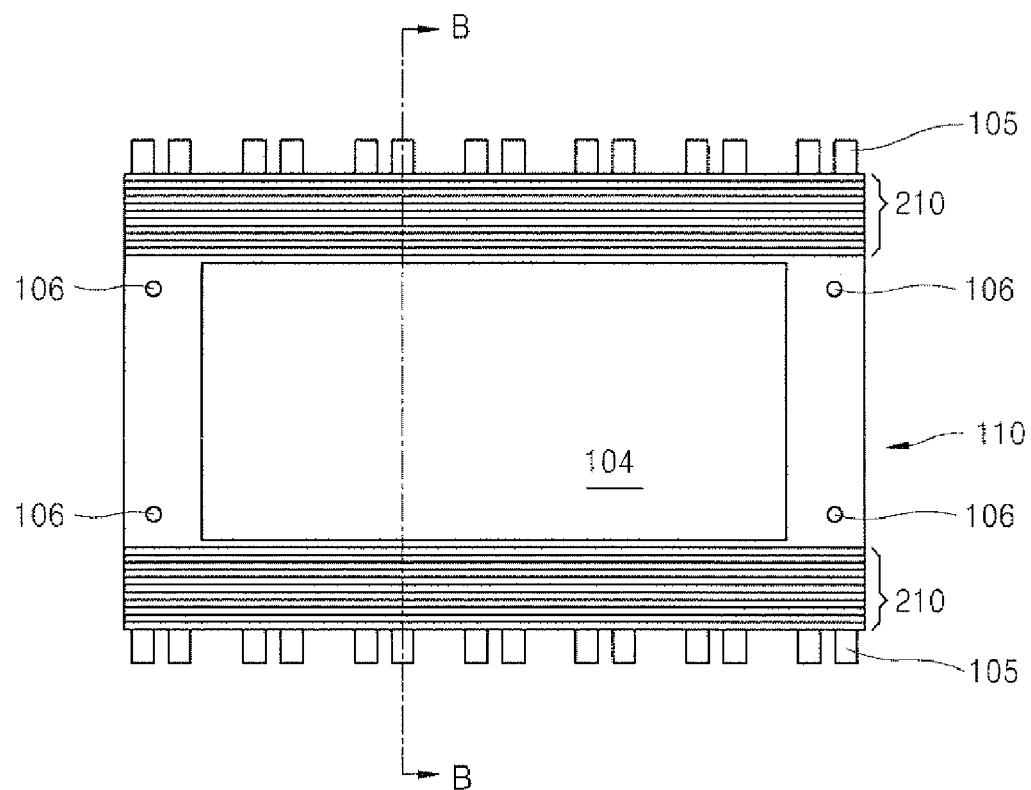

FIGS. 3A and 3B are plan views of the packages for power devices shown in FIGS. 2A and 2B. FIG. 2A is a sectional view taken along line A-A of FIG. 3A, and FIG. 2B is a sectional view taken along line B-B of FIG. 3B.

Referring to FIGS. 3A and 3B, the irregular portions 200 and 210 are formed on an edge of the packages 100 and 110 where the lead 105 is positioned. The irregular portions 200 and 210 may have a linear shape parallel to the edge of the packages 100 and 110 where the leads 105 are positioned, and be formed integrally along the edge of the packages 100 and 110, without interruption. Coupling holes 106 may be formed in the packages 100 and 110 to couple the heat sink 250 of FIGS. 2A and 2B to the packages 100 and 110.

Figure 4A:
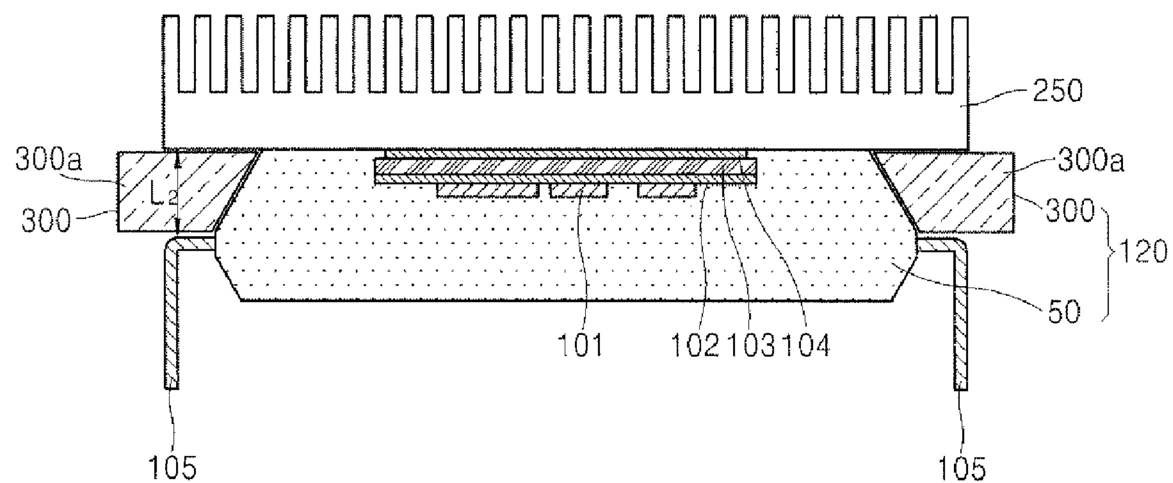
FIGS. 4A and 4B are sectional views of package assemblies for power devices and attached heat sinks according to two additional embodiments of the present invention.
Figure 4B:
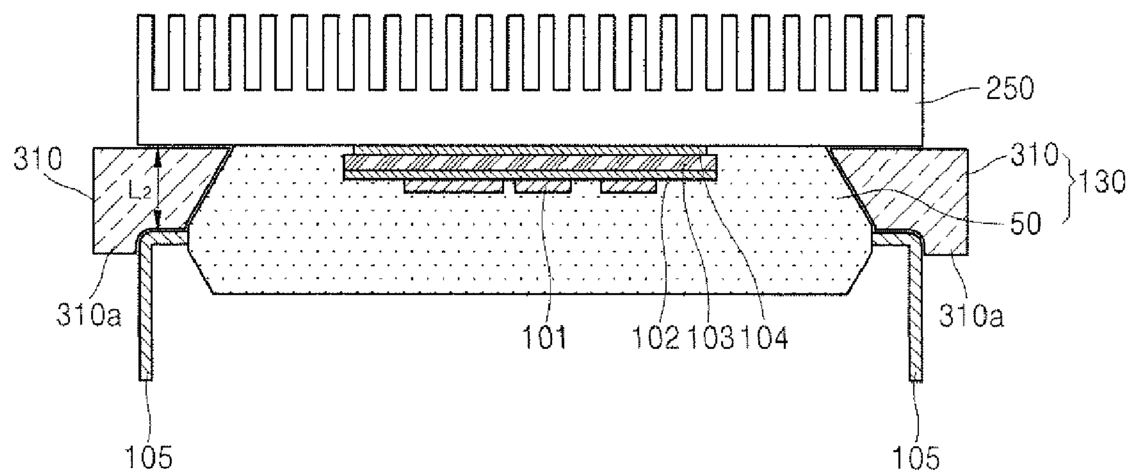

FIGS. 4A and 4B are sectional views of package assemblies 120 and 130 and attached heat sinks 250 for power devices according to two additional embodiments of the present invention.

Referring to FIGS. 4A and 4B, the package assemblies 130 and 140 include isolation spacers 300 and 310, respectively, filling a clearance distance $L_2$ between the leads 105 and the heat sink 150 attached to the package 50. The isolation spacers 300 and 310 may be made of ordinary isolating materials known in this field, e.g. inorganic oxide, rubber, silicone rubber, or polymer (resin) material.

The isolation spacers 300 may include edge portions **300*a* protruding horizontally past the edges of the heat sinks 250. Alternatively, the isolation spacers 310 may include edge portions 310*a* covering part of the leads 105, as shown in FIG. 4**B.

In the package assemblies 120 and 130 the clearance distance $L_2$ between the leads 105 and the heat sinks 250 is filled by the isolation spacers 300 and 310, thereby increasing the area of the heat sink 250 for improving heat transfer, without restricting the clearance distance $L_2$.

FIGS. SA through 5D are sectional views of package assemblies 140 through 170, respectively, for power devices with heat sinks 250 attached according to four more embodiments of the present invention.

Figure 5A:
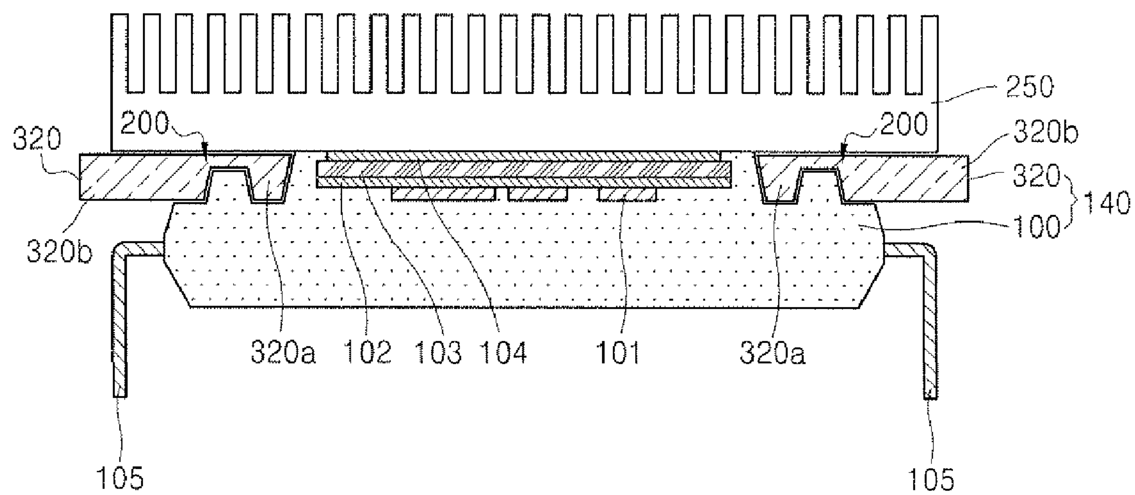
FIGS. 5A through 5D are sectional views of package assemblies for a power device and attached heat sinks according to four more embodiments of the present invention.
Figure 5B:
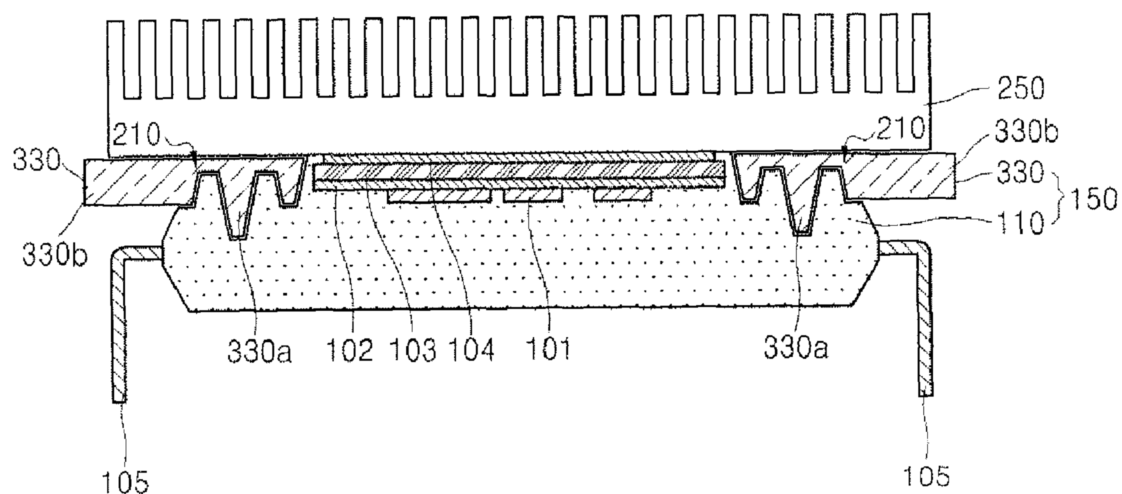
Figure 5C:
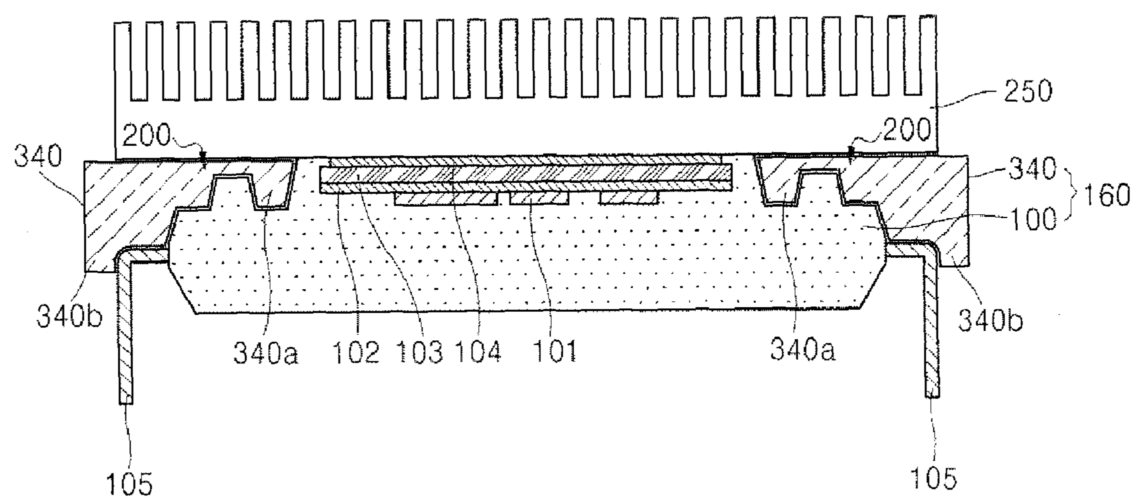
Figure 5D:
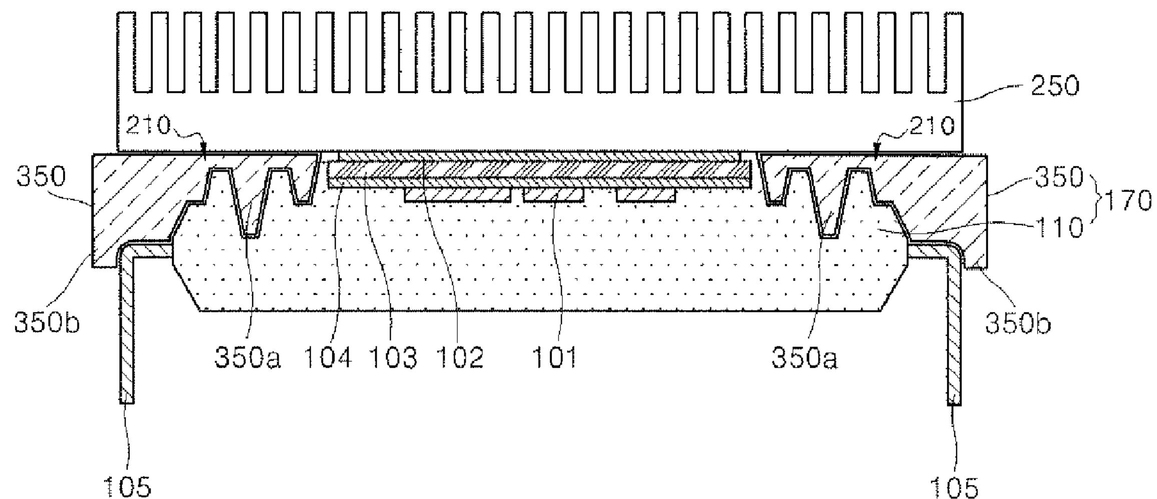

In FIGS. 5A and 5C package assemblies 140 and 160 include packages 100 with the irregular portions 200 that include one or more raised parts formed between the heat sinks 250 and the leads 105 as shown in FIG. 2A. In FIGS. 5B and 5D package assemblies 150 and 170 include packages 110 with the irregular portion 210 that include raised parts and one or more recessed parts formed alternately between the heat sinks 250 and the leads 105 as shown in FIG. 2B.

The irregular portions 200 and 210 are formed on the edges of the packages 100 and 110 where the leads 105 are positioned, as shown in FIGS. 3A and 3B. The irregular portions 200 and 210 may have a linear shape parallel to the edge of the packages 100 and 110 where the leads 105 are positioned, and may be formed integrally along the edges of the packages 100 and 110 without interruption.

In FIGS. 5A and 5B package assemblies 140, 150 include isolation spacers 320, 330 which have an irregular portion **320*a* shaped to fit into the irregular parts 200 and 210, respectively, of the packages 100 and 110, respectively. Also, the isolation spacer 320, 330 may include an edge portion 320*b*, 330*b* protruding horizontally past the edge of the heat sinks 250**

IN FIGS. 5C and 5D package assemblies 160, 170 include isolation spacers 340, 350 which have irregular portions **340*a*, 350*a* shaped to fit into the irregular portions 200 and 210, respectively, of the packages 100 and 110, respectively. Also, the isolation spacer 340, 350 may include an edge portion 340*b*, 350*b* covering part of the leads 105**.

Figure 6:
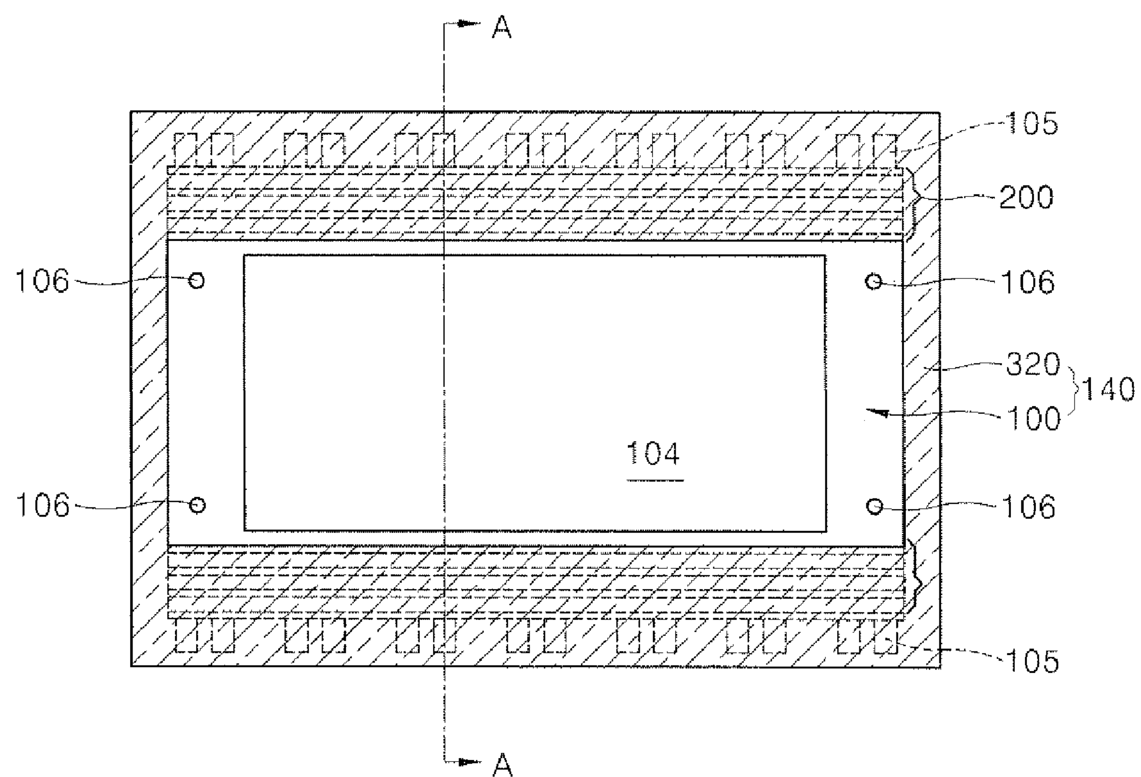
FIG. 6 is a plan view of the package assembly of FIG. 5A.

FIG. 6 is a plan view of the package assembly 140 for a power device of FIG. 5A. FIG. 6 can also illustrate the package assemblies 120, 130, 150-170 shown in FIGS. 4A, 4B, 5B, 5C and SD, except the difference in the shape of the irregular portion **320*a* of the isolation spacer 320 fitted into the irregular portion 200 of the package 100**.

Referring to FIGS. 6, the isolation spacers 300-350 are fabricated in one piece so as to fill the clearance distance between the heat sinks 250 and the packages 100 and 110. On the edges of the packages 100 and 110 where the leads 105 is formed, the isolation spacers 300-350 are inserted to fill the clearance distance between the heat sinks 250 and the edges of the packages 100 and 110. On the edges of the packages 100 and 110 where no leads are formed, the isolation spacers 300-350 surround the outside of the packages 100 and 110. As a result, the isolation spacers 300-350 may be firmly supported between the heat sinks 250 and the packages 100 and 110 without any adhesive or joining member.

Figure 7:
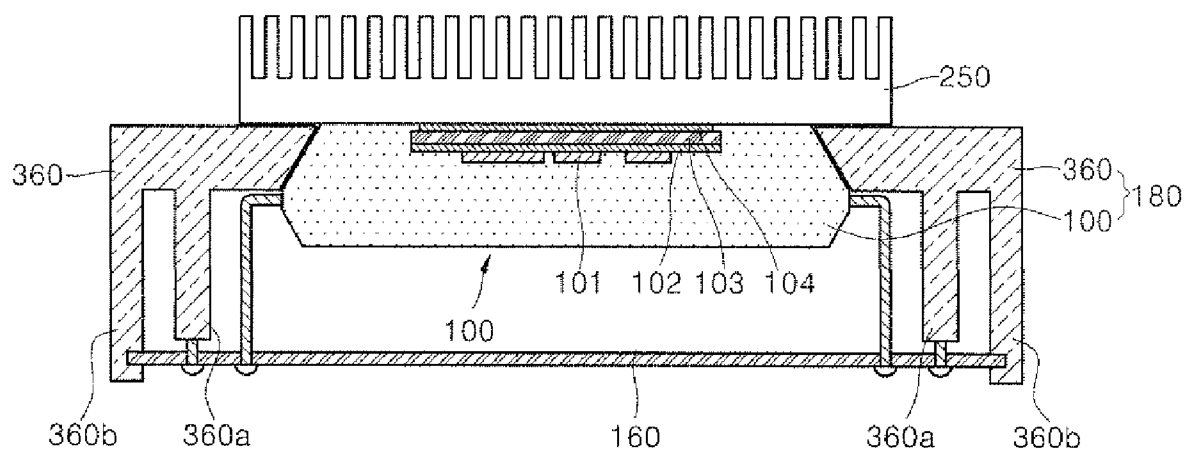
FIG. 7 is a sectional view of a package assembly for a power device and an attached heat sink according to still another embodiment of the present invention.

FIG. 7 is a sectional view of an isolation spacer 360 of a package assembly 180 for a power device with a heat sink 250 attached according to another embodiment of the present invention.

Referring to FIG. 7, the isolation spacer 360 may further include support portions 360*a* and 360*b* which are fixed to a printed circuit board 160 on which the package 100 is mounted. The support portions 360*a* and 360*b* mechanically support the isolation spacer 360 by passing through and/or holding the printed circuit board 160, respectively.

As described above, the package for a power device includes the irregular portion on the package between the heat sink attached to the package and the lead, thereby increasing the surface path from the lead to the heat sink for increasing the creepage distance $L_1$. Thus, heat sinks of various sizes and contact areas can be used for the package for a power device, without the prior art level of restraint on creepage distance.

Further, the package assembly for a power device includes the isolation spacer which fills the clearance distance between the package and the heat sink to stabilize the clearance distance between the lead and the heat sink, so that heat sinks of various sizes and contact areas can be used for the package assembly for a power device without the restraint of the clearance distance. In addition, the package of the package assembly for a power device includes the irregular portion thereon between the heat sink and the lead, and thus the package assembly can be used with heat sinks of various sizes and contact areas, without the prior art levels of restraint on clearance distance and creepage distance.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A package for a power device in which the power device is encapsulated and electrically connected to a lead protruding outside the package, the package comprising:

an irregular portion of the package between the lead and a heat sink attached to the package, wherein the irregular portion has a maximum height less than that of a portion of the package directly contacting the heat sink so as to increase a creepage distance, defined by a surface path on the package from the lead to the portion of the package directly contacting the heat sink.

2. The package of claim 1, wherein the irregular portion is formed on an edge of the package where the lead is positioned.

3. The package of claim 1, wherein the irregular portion has a linear shape parallel to the edge of the package where the lead is positioned.

4. The package of claim 1, wherein the irregular portion is formed integrally along the edge of the package where the lead is positioned, without interruption.

5. The package of claim 1, wherein the power device has an operation voltage and impulse voltage in the range of 600V-2000V.

6. A package assembly for a power device, comprising:

a package in which the power device is encapsulated and is electrically connected to a lead protruding outside the package;

a heat sink attached to the package, wherein at least an edge portion of the heat sink is laterally extended past a portion of the package directly contacting the heat sink;

an electrical isolation spacer filling a clearance distance between the lead and at least the edge portion of the heat sink; and an irregular portion of the package between the heat sink and the lead, wherein the irregular portion has a maximum height less than that of a portion directly contacting the heat sink so as to increase a creepage distance, defined by a surface path on the package from the lead to the portion of the package directly contacting the heat sink.

7. The package assembly of claim 6, wherein the package comprises an exposed metallic heat conductive plate which contacts the heat sink.

8. The package assembly of claim 6, wherein the electrical isolation spacer is formed of inorganic oxide, rubber, or polymer (resin) materials.

9. The package assembly of claim 6, wherein the electrical isolation spacer comprises an edge portion protruding horizontally past the edge of the heat sink.

10. The package assembly of claim 6, wherein the electrical isolation spacer comprises an edge portion covering part of the lead.

11. The package assembly of claim 6, wherein the electrical isolation spacer comprises an irregular portion shaped to fit into the irregular portion of the package.

12. The package assembly of claim 6, wherein the electrical isolation spacer is formed in one piece so as to fill the clearance distance between the lead and the heat sink.

13. The package assembly of claim 6, wherein the electrical isolation spacer comprises a support portion fixed to a printed circuit board on which the package is mounted.

14. The package assembly of claim 6, wherein the power device has an operation voltage and impulse voltage in the range of 600V-2000V.

15. The package assembly of claim 1, wherein at least an edge portion of the heat sink is laterally extended past a portion of the package contacting the heat sink.

16. The package assembly of claim 1, further comprising an electrical isolation spacer filling a clearance distance between the lead and at least an edge portion of the heat sink.

* * * * *